(12) United States Patent
Yin et al.

(10) Patent No.: US 7,015,115 B1
(45) Date of Patent: Mar. 21, 2006

(54) METHOD FOR FORMING DEEP TRENCH ISOLATION AND RELATED STRUCTURE

(75) Inventors: Kevin Q. Yin, Irvine, CA (US); Amol Kalburge, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/371,307

(22) Filed: Feb. 20, 2003

(51) Int. Cl.
*H01L 21/76* (2006.01)

(52) U.S. Cl. .................. 438/431; 438/430; 438/432; 438/439; 438/444; 438/700; 438/361

(58) Field of Classification Search ............... 438/425, 438/426, 430, 431, 432, 439, 444, 445, 452, 438/700, 353, 361, 362; 257/505, 513
See application file for complete search history.

(56) References Cited

U.S. PATENT DOCUMENTS

| | | | | |
|---|---|---|---|---|
| 5,106,777 A | * | 4/1992 | Rodder | 438/426 |
| 5,306,940 A | * | 4/1994 | Yamazaki | 257/374 |
| 5,455,194 A | * | 10/1995 | Vasquez et al. | 438/425 |
| 5,474,953 A | * | 12/1995 | Shimizu et al. | 438/426 |
| 5,776,808 A | * | 7/1998 | Muller et al. | 438/243 |
| 6,251,739 B1 | * | 6/2001 | Norstrom et al. | 438/369 |
| 6,284,593 B1 | * | 9/2001 | Mandelman et al. | 438/248 |
| 6,406,972 B1 | * | 6/2002 | Norstrom et al. | 438/404 |
| 6,498,069 B1 | * | 12/2002 | Grivna | 438/386 |
| 6,596,608 B1 | * | 7/2003 | Saito | 438/424 |
| 6,610,578 B1 | * | 8/2003 | Norstrom et al. | 438/369 |

* cited by examiner

*Primary Examiner*—Maria F. Guerrero
(74) *Attorney, Agent, or Firm*—Farjami & Farjami LLP

(57) ABSTRACT

According to one embodiment, a structure comprises a substrate and a field oxide region, where the field oxide region has a top surface, and where the top surface of the field oxide region comprises substantially no cavities caused by lateral etching. The structure further comprises a trench situated in the substrate, where the trench has a first sidewall and a second sidewall in the substrate, and where the trench is situated directly underneath the field oxide region. According to this embodiment, the trench is used as a deep trench isolation region in the substrate and is typically filled with polysilicon. A thermally grown oxide liner is situated on the first and the second sidewalls of the trench, where the oxide liner is formed after removal of a hard mask. The hard mask may be densified TEOS oxide or HDP oxide and may be removed in an anisotropic dry etch process.

8 Claims, 9 Drawing Sheets

METHOD FOR FORMING DEEP TRENCH ISOLATION AND RELATED STRUCTURE

BACKGROUND OF THE INVENTION

1. Field of the Invention

The present invention relates to the field of fabrication of semiconductor devices. More specifically, the invention relates to forming isolation regions in semiconductor substrates.

2. Background Art

In a Bipolar Complementary-Metal-Oxide-Semiconductor ("BiCMOS") process, deep trench isolation regions are typically formed to provide isolation between adjacent active regions of a semiconductor substrate. A deep trench isolation region may electrically isolate, for example, a bipolar transistor, such as a silicon-germanium heterojunction bipolar transistor, from an adjacent CMOS transistor, such as a PFET, fabricated on the same semiconductor substrate. Deep trench isolation regions may be formed on a substrate after formation of, for example, field oxide isolation regions, a buried layer, and an epitaxial layer of silicon.

In a typical conventional deep trench isolation process flow, a layer of silicon nitride ("nitride") is deposited on a silicon substrate at a thickness of approximately 1500 Angstroms, for example. A hard mask having an approximate thickness of 4500 Angstroms and comprising densified tetraethylorthosilicate ("TEOS") oxide or high-density plasma ("HDP") oxide is then formed over the nitride layer. A photoresist mask is formed and patterned over the hard mask, and a trench is etched to a depth just below a field oxide region. After removal of the photoresist mask, the trench is further etched into the silicon substrate to a depth of between approximately 7.0 and 10.0 microns. During trench etching, the hard mask is also etched, which results in a reduction in hard mask thickness by approximately one half. After performance of cleaning and other preparatory steps as known in the art, a densified TEOS oxide liner is formed on the sidewalls of the trench and on the surface of the silicon substrate. The TEOS oxide liner may have a thickness of approximately 1000.0 Angstroms or greater.

Next, in the conventional deep trench isolation process discussed above, a conformal layer of polycrystalline silicon (also referred to as polysilicon) is deposited over the silicon substrate and trench. The layer of polysilicon is then recess etched in the trench to a depth of approximately 1500.0 Angstroms below the interface of the field oxide region and the nitride layer. The densified TEOS oxide liner situated on the sidewalls of the deep trench and on the silicon substrate surface is then removed in a wet etch process utilizing a buffered oxide etchant ("BOE"). However, since the polysilicon is recess etched to a depth of approximately 1500.0 Angstroms below the nitride layer, the BOE wet etch causes severe lateral etching of portions of the field oxide region situated on the sidewalls of the trench.

In an attempt to reduce the severe field oxide undercutting discussed above, semiconductor manufacturers have utilized a dry etch in place of the BOE wet etch. However, the dry etch approach causes formation of a non-uniform "mini-trench" or cavity on either side of the polysilicon-filled trench. As a result, removal of the densified TEOS oxide liner utilizing either the BOE wet etch or the dry etch approach causes undesirable deep mini-trenches or cavities to be formed in the field oxide.

Thus, there is a need in the art for effective deep trench isolation in a semiconductor substrate.

SUMMARY OF THE INVENTION

The present invention is directed to method for forming deep trench isolation and related structure. The present invention addresses and resolves the need in the art for effective deep trench isolation in a semiconductor substrate.

According to one exemplary embodiment, a structure comprises a substrate. The structure further comprises a field oxide region situated in the substrate, where the field oxide region has a top surface, and where the top surface of the field oxide region comprises substantially no cavities caused by lateral etching. The field oxide region may have a thickness of, for example, approximately 3000.0 Angstroms. The structure further comprises a trench situated in the substrate, where the trench has a first sidewall and a second sidewall in the substrate, and where the trench is situated directly underneath the field oxide region. According to this exemplary embodiment, the trench is used as a deep trench isolation region in the substrate and is typically filled with polysilicon. The trench may have a depth of, for example, between approximately 3.0 microns and approximately 7.0 microns and may have a width of, for example, approximately 1.0 micron.

According to this exemplary embodiment, the structure further comprises a thermally grown oxide liner situated on the first and the second sidewalls of the trench, where the oxide liner is formed after removal of a hard mask. The oxide line may have a thickness of, for example, approximately 1000.0 Angstroms. The hard mask may be densified TEOS oxide or HDP oxide and may be removed in an anisotropic dry etch process, for example. According to one embodiment, the invention is a method for achieving the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to method for forming deep trench isolation and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The present invention involves a method of forming deep trench isolation that causes substantially no lateral etching of field oxide. As will be discussed in detail below, by causing substantially no lateral etching of field oxide, the present invention advantageously achieves a final topography that is substantially flat over a deep trench isolation region. The innovative method of the present invention can be applied in, for example, BiCMOS applications to achieve effective formation of deep trench isolation regions.

Figure 1:
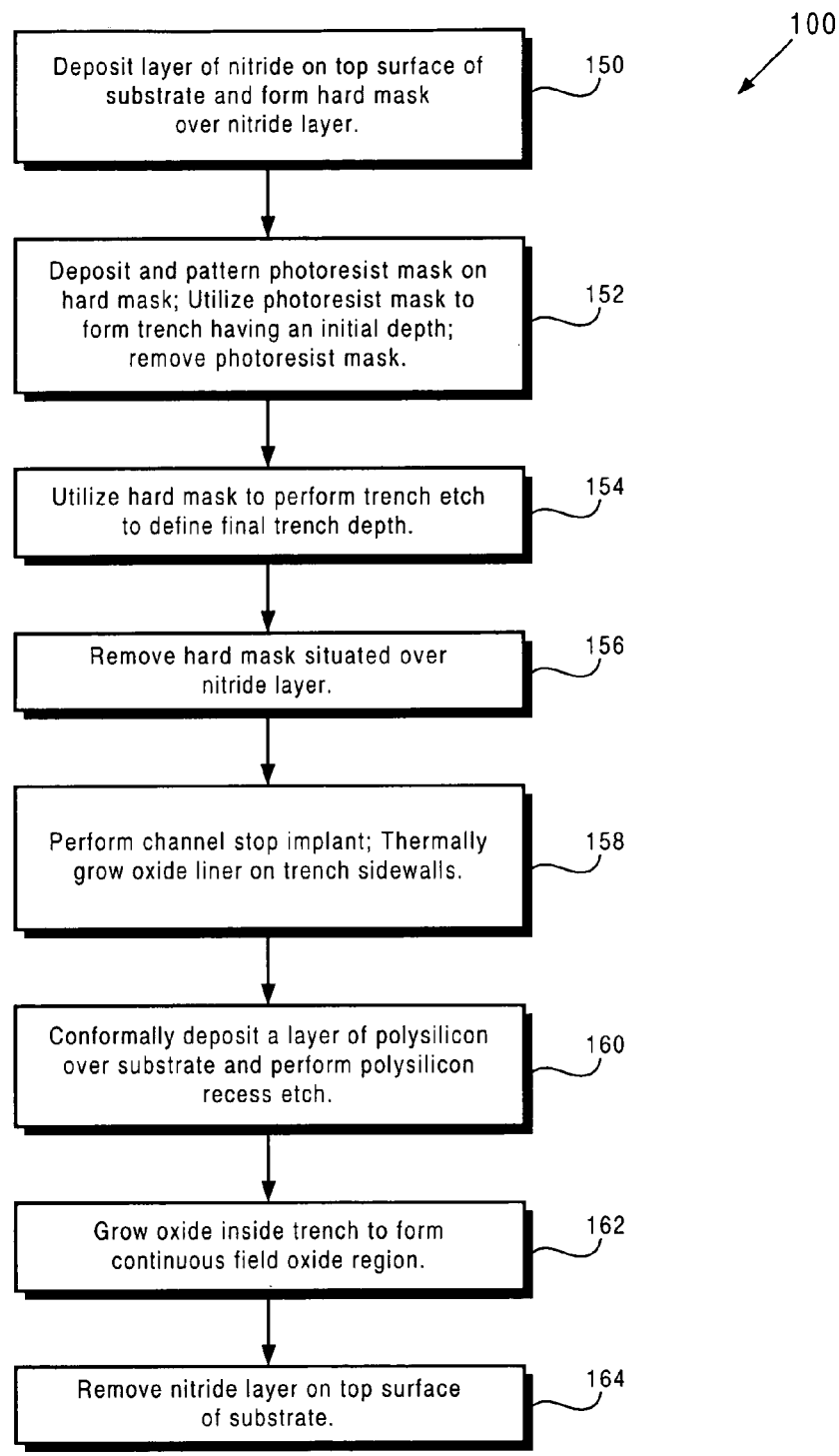
FIG. 1 shows a flowchart illustrating the steps taken to implement an embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 150 through 164 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes field oxide regions, a buried layer, and an epitaxial layer situated over the buried layer.

Moreover, structures 250 through 264 in FIGS. 2A through 2H illustrate the result of performing, on the semiconductor structure discussed above, steps 150 through 164 of flowchart 100, respectively. For example, structure 250 shows the semiconductor structure discussed above after processing step 150, structure 252 shows structure 250 after the processing of step 152, structure 254 shows structure 252 after the processing of step 154, and so forth. It is noted that although formation of only one deep trench isolation region is specifically discussed herein to preserve brevity, multiple deep trench isolation regions can be formed in a substrate utilizing the innovative process of the present invention.

Figure 2A:
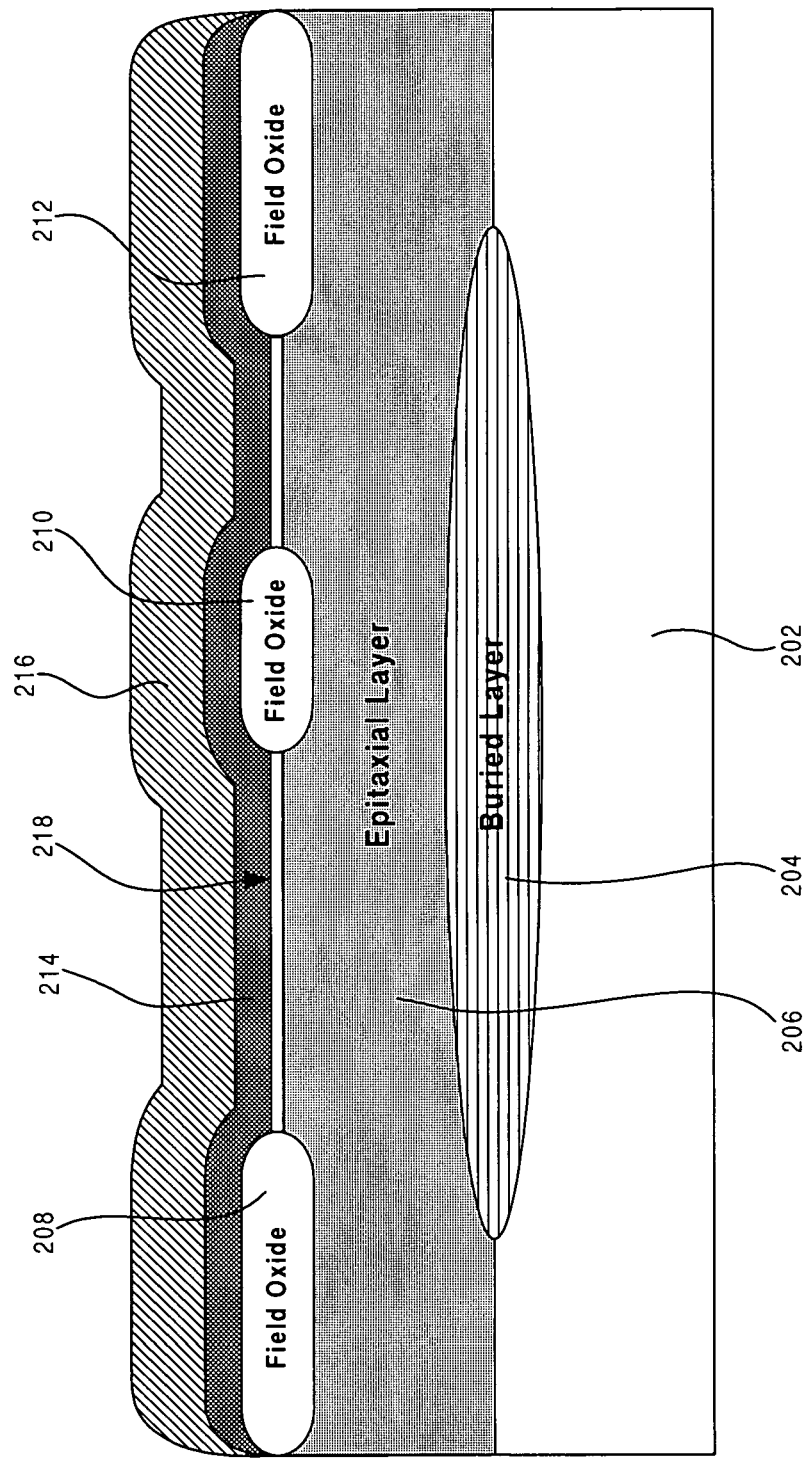
FIG. 2A illustrates cross-sectional views, which include portions of a wafer processed according to an embodiment of the invention, corresponding to certain steps of the flowchart in FIG. 1.

Referring now to FIG. 2A, structure 250 of FIG. 2A shows an exemplary structure including a silicon substrate that includes field oxide regions, a buried layer, and an epitaxial layer, after completion of step 150 of flowchart 100 in FIG. 1. In structure 250, buried layer 204, epitaxial layer 206, and field oxide regions 208, 210, and 212 are formed in silicon substrate 202. Buried layer 204 is formed in silicon substrate 202 in a manner known in the art and can comprise, for example, heavily doped N-type material. Epitaxial layer 206 can comprise single-crystal silicon, which can be epitaxially grown on silicon substrate 202 in a manner known in the art. Field oxide regions 208, 210, and 212 comprise silicon oxide and may be formed in silicon substrate 202 in a manner known in the art.

Continuing with step 150 in FIG. 1 and structure 250 in FIG. 2A, at step 150 of flowchart 100, silicon nitride ("nitride") layer 214 is deposited on top surface 218 of silicon substrate 202 and hard mask 216 is formed on nitride layer 214. Nitride layer 214 can be formed, for example, by depositing a layer of nitride on top surface 218 of silicon substrate 202 in a low pressure chemical vapor deposition ("LPCVD") process and can have a thickness of approximately 1500.0 Angstroms, for example. Hard mask 216 can comprise densified oxide, which can be formed by depositing TEOS oxide on nitride layer 214 in an LPCVD process and densifying the TEOS oxide in a manner known in the art. In one embodiment, hard mask 216 can comprise high-density plasma ("HDP") oxide. The thickness of hard mask 216 can be, for example, approximately 4500.0 Angstroms. The result of step 150 of flowchart 100 is illustrated by structure 250 in FIG. 2A.

Figure 2B:
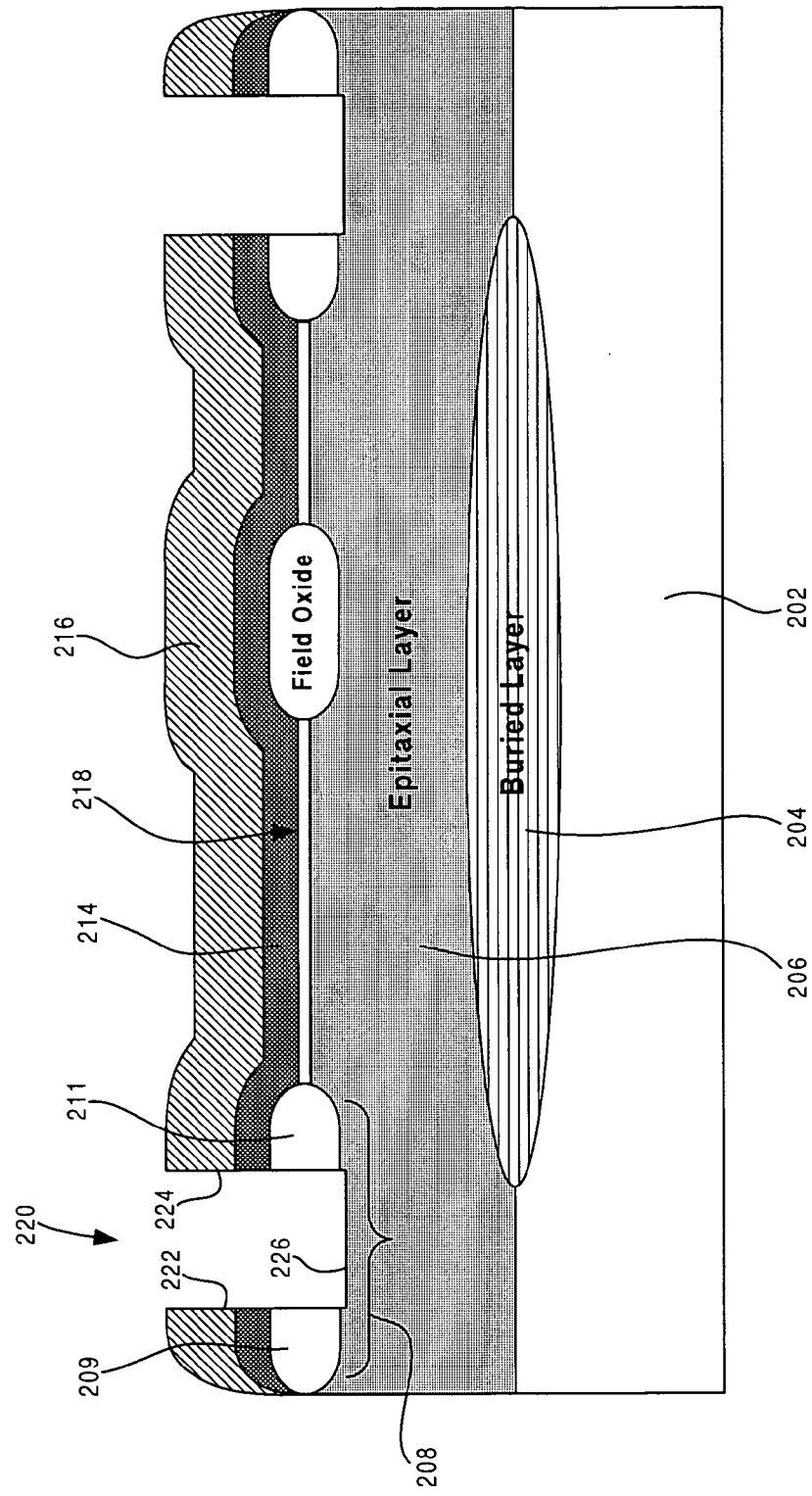
FIG. 2B illustrates cross-sectional views, which include portions of a wafer processed according to an embodiment of the invention, corresponding to certain steps of the flowchart in FIG. 1.

Referring to step 152 in FIG. 1 and structure 252 in FIG. 2B, at step 152 of flowchart 100, a photoresist mask is deposited and patterned on hard mask 216, the patterned photoresist mask is utilized to form trench 220 having an initial depth, and the photoresist mask is then removed. The photoresist mask can be deposited and patterned on hard mask 216 in a manner known in the art to achieve a trench opening in the photoresist mask having a width substantially equal to a critical dimension ("CD"). In a first etch step, trench 220 can be formed by utilizing an etchant such as CF4/CHF3/Ar or other appropriate etchant and adjusting the etchant chemistry to sequentially etch through hard mask 216, nitride layer 214, field oxide region 208, and etch a short distance into epitaxial layer 206. The resulting trench 220 formed by the etch step discussed above defines sidewalls 222 and 224 and bottom surface 226. Bottom surface 226 of trench 220 can extend into epitaxial layer 206 to an initial depth a short distance below field oxide region 208. Field oxide portions 209 and 211, which are situated adjacent to sidewalls 222 and 224, respectively, are formed as a result of the etch step discussed above.

In a second etch step, the photoresist mask can be removed from hard mask 216 and polymer residue formed as a result of the first etch step discussed above can be removed from sidewalls 222 and 224 of trench 220 in a wet strip utilizing an appropriate etchant as known in the art. The width of trench 220 is determined by the CD of the trench opening patterned in the photoresist mask discussed above, and can be, for example, approximately 1.0 micron. The result of step 152 of flowchart 100 is illustrated by structure 252 in FIG. 2B. It is noted that in FIG. 2B and in subsequent figures, only trench 220 is specifically discussed to preserve brevity.

Figure 2C:
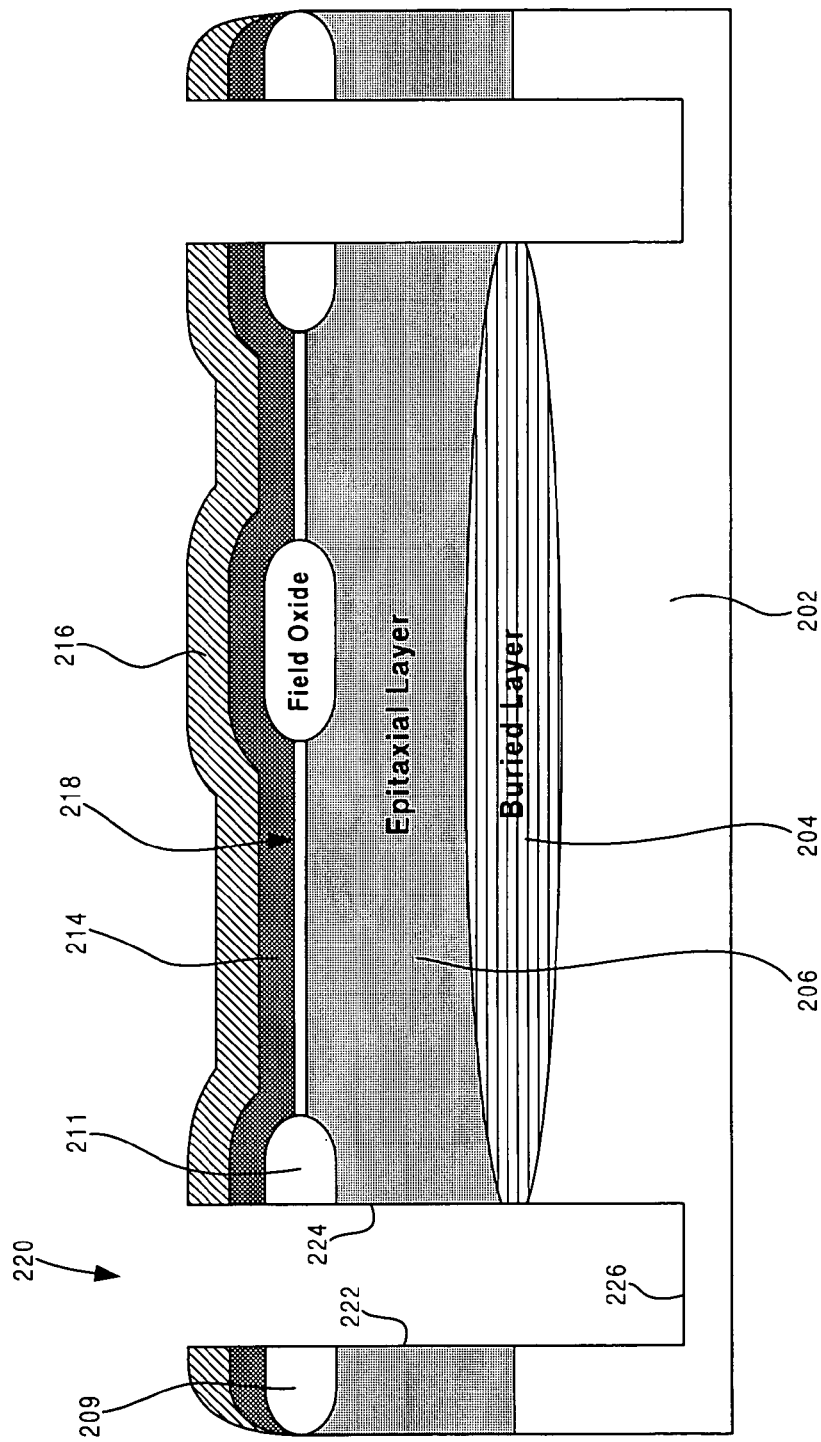
FIG. 2C illustrates cross-sectional views, which include portions of a wafer processed according to an embodiment of the invention, corresponding to certain steps of the flowchart in FIG. 1.

Referring to step 154 in FIG. 1 and structure 254 in FIG. 2C, at step 154 of flowchart 100, hard mask 216 is utilized to perform a trench etch to define a final depth of trench 220. The trench etch can be performed by utilizing an appropriate etchant to etch silicon in epitaxial layer 206 to increase the depth of trench 220 to a final depth of, for example, approximately 7.0 microns. In one embodiment, the trench etch discussed above can be utilized to increase the depth of trench 220 to a final depth of between approximately 3.0 and approximately 7.0 microns. During the trench etch, a portion of hard mask 216 is also removed, which reduces the thickness of hard mask 216 by approximately one half. By way of example, hard mask 216 can be reduced from an initial thickness of approximately 4500.0 Angstroms to a thickness of approximately 2250.0 Angstroms as a result of the trench etch. After performance of the trench etch discussed above, a post trench clean can be performed by utilizing a diluted HF dip or other appropriate etchant to remove approximately 200.0 Angstroms of oxide from sidewalls 222 and 224 of trench 220. The result of step 154 of flowchart 100 is illustrated by structure 254 in FIG. 2C.

Figure 2D:
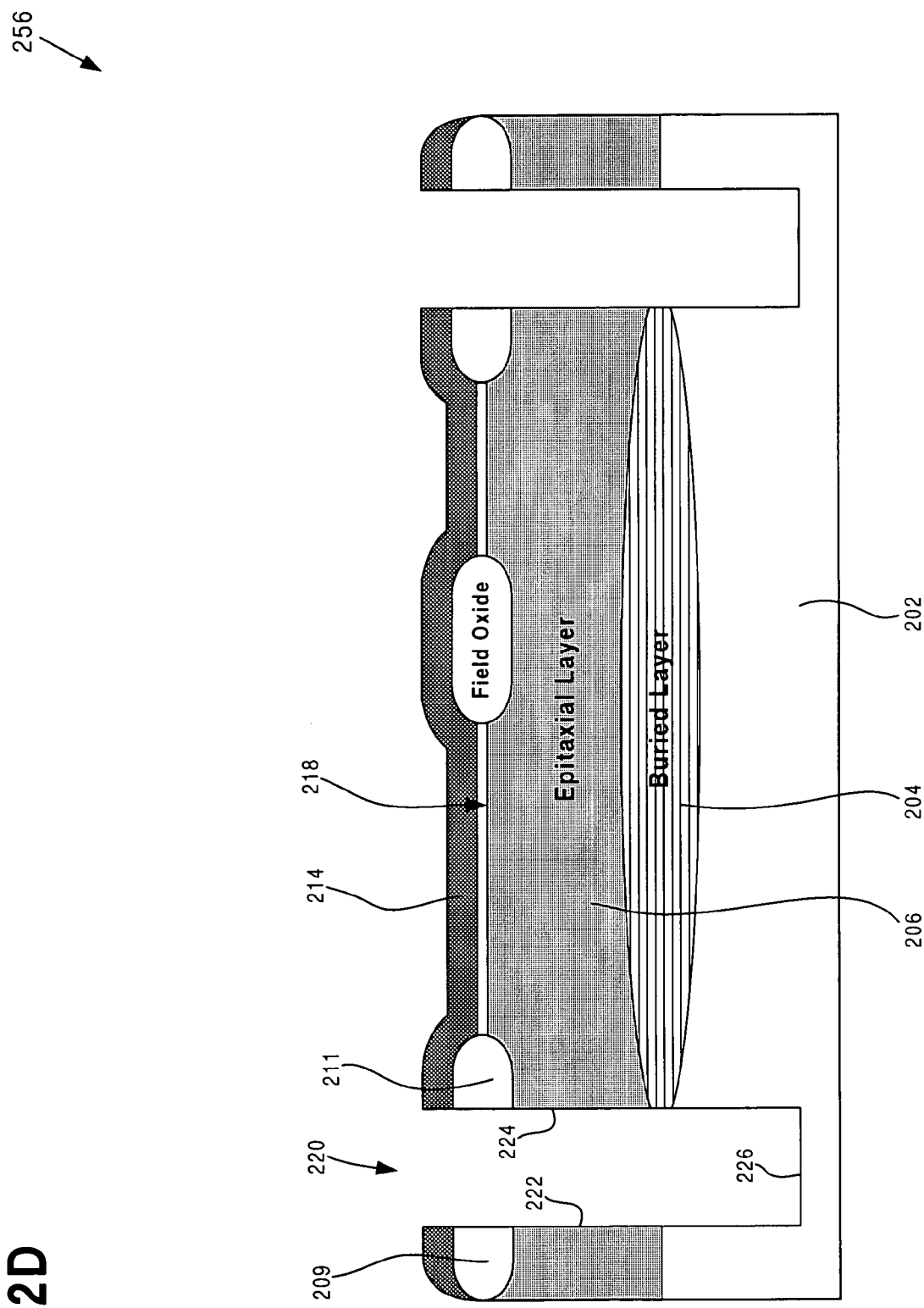
FIG. 2D illustrates cross-sectional views, which include portions of a wafer processed according to an embodiment of the invention, corresponding to certain steps of the flowchart in FIG. 1.

Referring to step 156 in FIG. 1 and structure 256 in FIG. 2D, at step 156 of flowchart 100, hard mask 216 is removed. In the present embodiment, hard mask 216 can be removed in an anisotropic dry etch process that is selective to silicon and nitride and utilizes an etchant such as C4F8/CO/Ar or other appropriate etchant. As a result of the high selectivity of the anisotropic dry etch process, the etchant does not significantly damage nitride layer 214 or silicon situated at bottom surface 226 of trench 220. By way of example, the anisotropic dry etch process causes a loss of less than 100.0 Angstroms of nitride in nitride layer 214. By utilizing an anisotropic dry etch to remove hard mask 216, the present invention can maintain a uniform trench width of approximately 1.0 micron, for example. In contrast, in a process utilizing a wet etch to remove hard mask 216, portions of field oxide 208 can be etched, which can undesirably alter the shape of trench 220. After removal of hard mask 216, sidewalls 222 and 224 of trench 220 can be cleaned by utilizing, for example, a plasma etch and an HF strip to remove polymer by-products formed on sidewalls 222 and 224 during etching of hard mask 216. After removal of hard mask 216, sidewalls 222 and 224 of trench 220 can be cleaned by utilizing, for example, a plasma etch and an HF strip to remove polymer by-products formed on sidewalls 222 and 224 during etching of hard mask 216. The result of step 156 of flowchart 100 is illustrated by structure 256 in FIG. 2D.

Figure 2E:
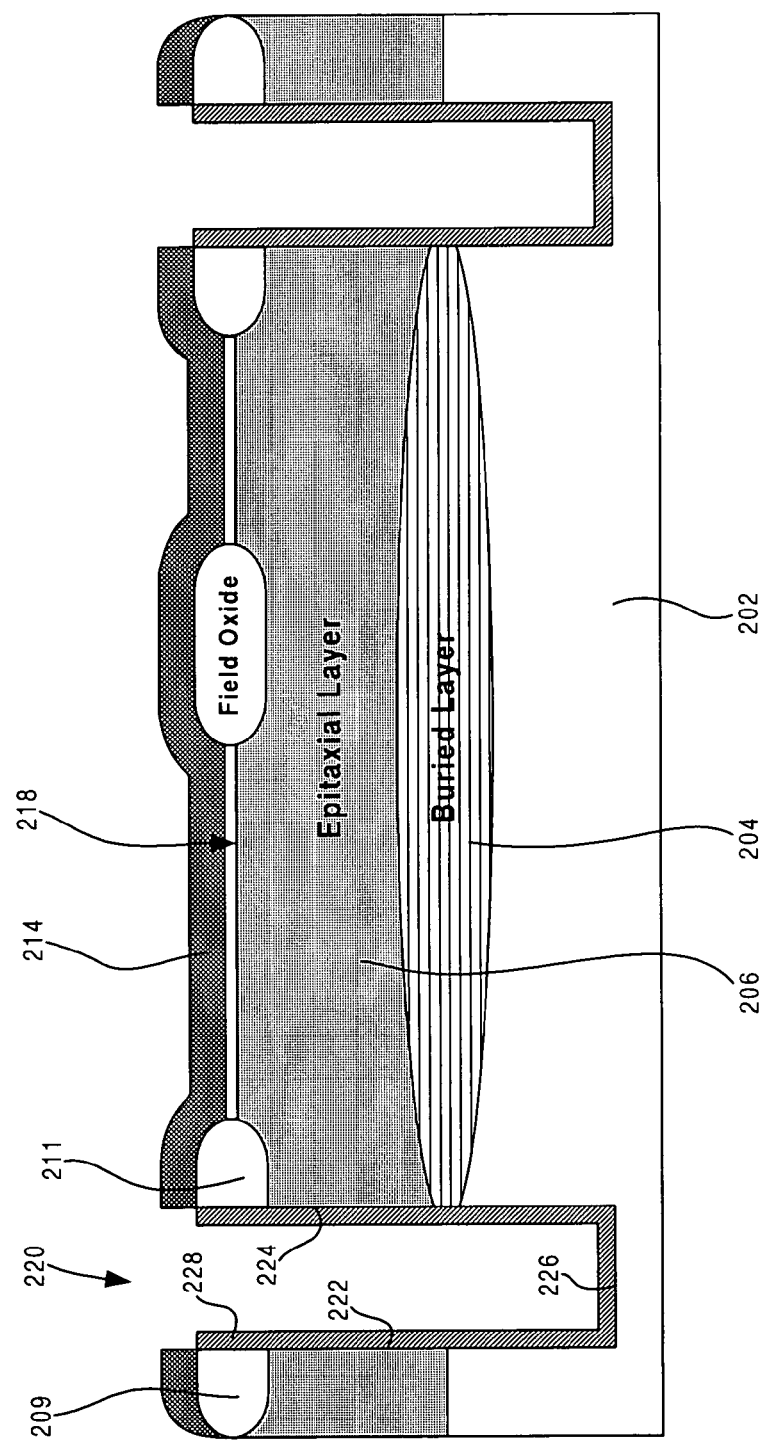
FIG. 2E illustrates cross-sectional views, which include portions of a wafer processed according to an embodiment of the invention, corresponding to certain steps of the flowchart in FIG. 1.

Referring to step 158 in FIG. 1 and structure 258 in FIG. 2E, at step 158 of flowchart 100, a channel stop implant is performed and oxide liner 228 is thermally grown on sidewalls 222 and 224 and bottom surface 226 of trench 220 and over nitride layer 214 situated on substrate 202.

In the channel stop implant performed in step 158, a dopant such as boron, for example, can be implanted in bottom surface 226 of trench 220 to prevent current leakage. A wet strip can be performed to eliminate carbon and metal contamination resulting from the channel stop implant. Also, prior to thermally growing oxide liner 228, a thirty-second HF preclean can be performed to appropriately clean sidewalls 222 and 224 and bottom surface 226 of trench 220.

Next, oxide liner 228 is formed by thermally growing oxide on sidewalls 222 and 224 and bottom surface 226 of trench 220. The layer of thermal oxide can be densified by utilizing, for example, a temperature of approximately 750° C. and an inert gas such as nitrogen to complete formation of oxide liner 228. By way of example, oxide liner 228 can have a thickness of approximately 1000.0 Angstroms.

Since oxide liner 228 comprises thermally grown oxide, oxide liner 228 is not formed on nitride layer 214 situated on top surface 218 of silicon substrate 202. By not forming oxide liner 228 on nitride layer 214, a buffered oxide echant ("BOE") wet strip does not need to be performed in a subsequent step to remove oxide liner 228. As a result, the present invention advantageously eliminates field oxide lateral etching or undercutting caused by a BOE wet strip. By eliminating field oxide lateral etching, the present invention advantageously achieves a substantially flat final topography over a subsequently formed deep trench isolation region. The result of step 158 of flowchart 100 is illustrated by structure 258 in FIG. 2E.

Figure 2F:
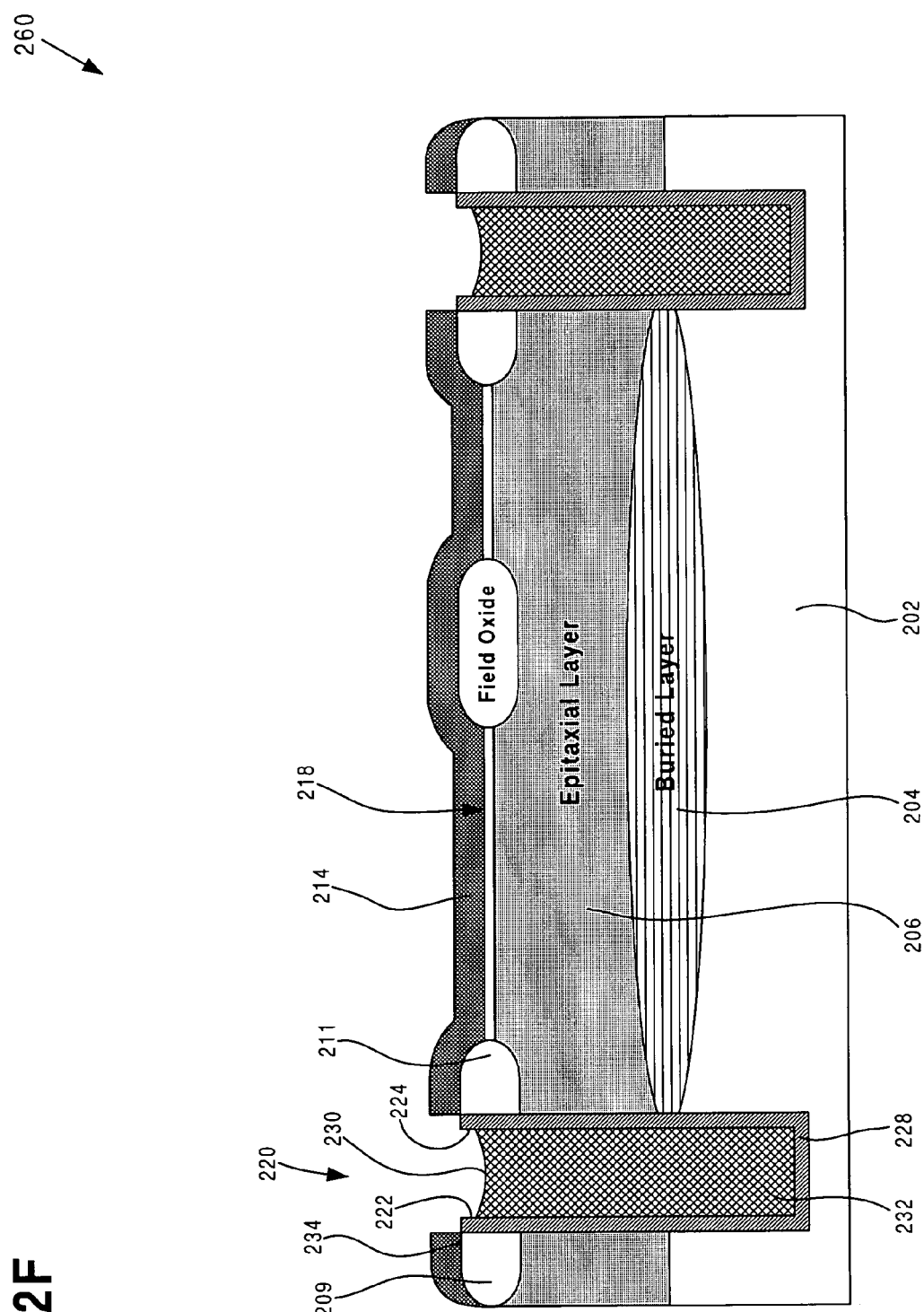
FIG. 2F illustrates cross-sectional views, which include portions of a wafer processed according to an embodiment of the invention, corresponding to certain steps of the flowchart in FIG. 1.

Referring to step 160 in FIG. 1 and structure 260 in FIG. 2F, at step 160 of flowchart 100, a layer of polysilicon is conformally deposited over substrate 202 and etched in an etch back process. The layer of polysilicon can be conformally deposited over substrate 202 at a thickness of, for example, approximately 1.5 microns. As a result of conformal polysilicon deposition process discussed above, deposited polysilicon fills trench 220. In the etch back process, a break-through etch is first performed utilizing, for example, a CF4 etch chemistry to break through an oxide skin that is usually formed on the layer of polysilicon. Next, a main etch is performed utilizing, for example, an SF6/O2 etch chemistry, followed by an over etch utilizing, for example, a C12/HBr etch chemistry. As a result of the etch back process discussed above, the layer of polysilicon is etched back to depth 230 inside trench 220 to form polysilicon portion 232. Depth 230 can be, for example, approximately 1500.0 Angstroms below interface 234, which is situated at a boundary of field oxide portion 209 (or field oxide portion 211) and nitride layer 214. Since the respective etch chemistries utilized to perform the main etch and the over etch discussed above are highly selective to oxide, minimal etching of oxide liner 228 occurs during the polysilicon etch back process. The result of step 160 of flowchart 100 is illustrated by structure 260 in FIG. 2F.

Figure 2G:
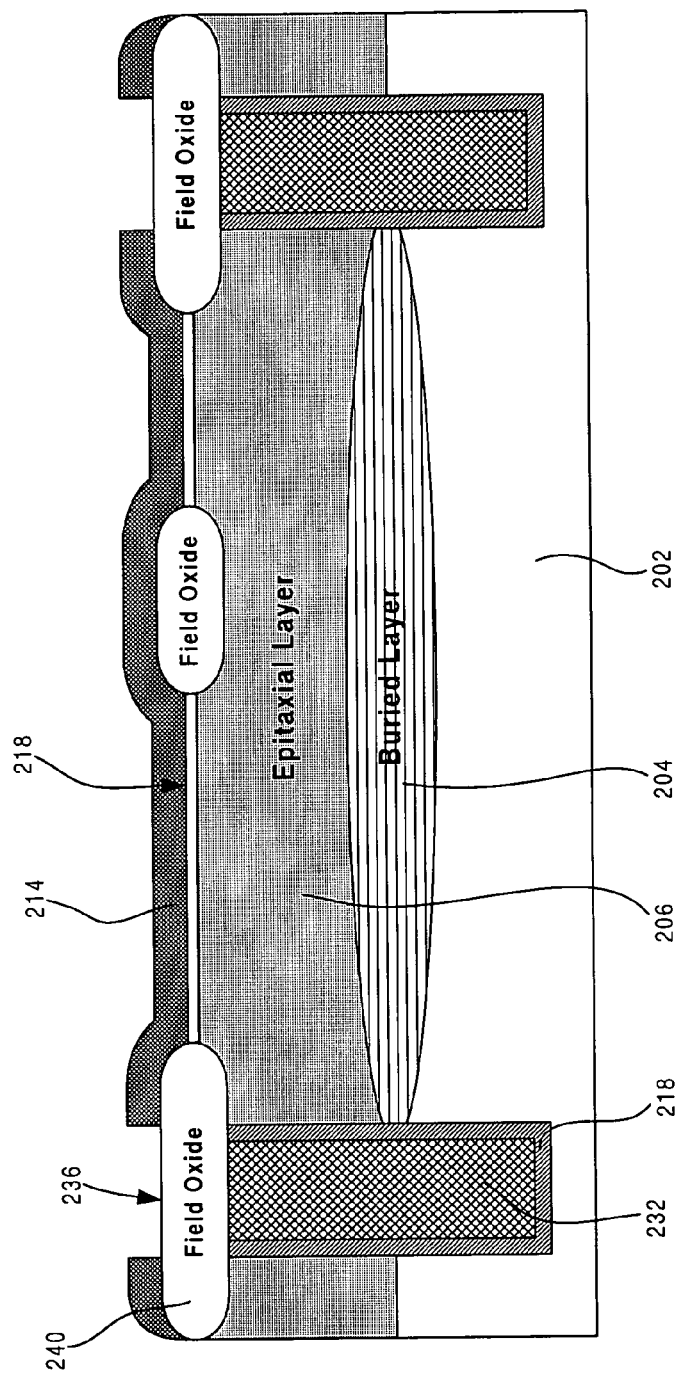
FIG. 2G illustrates cross-sectional views, which include portions of a wafer processed according to an embodiment of the invention, corresponding to certain steps of the flowchart in FIG. 1.
Figure 2H:
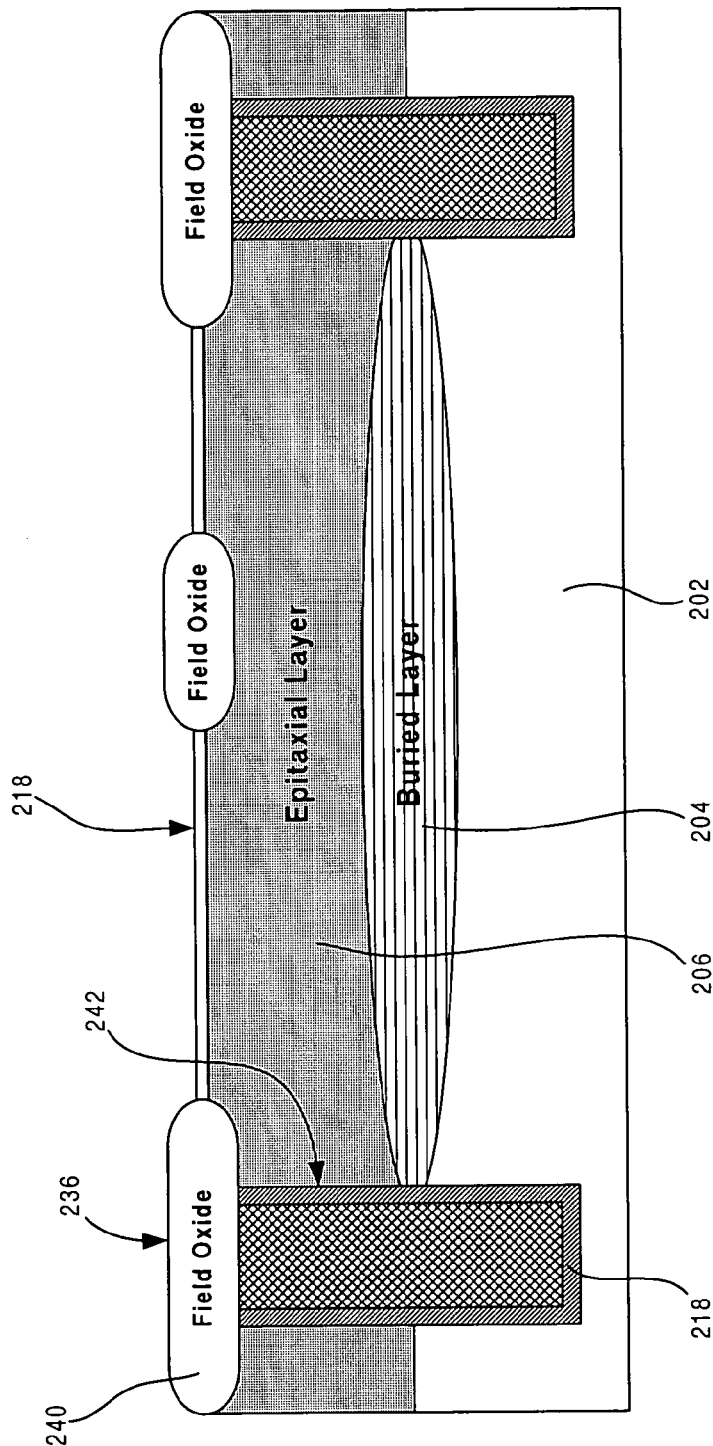
FIG. 2H illustrates cross-sectional views, which include portions of a wafer processed according to an embodiment of the invention, corresponding to certain steps of the flowchart in FIG. 1.

Referring to step 162 in FIG. 1 and structure 262 in FIG. 2G, at step 162 of flowchart 100, oxide is grown inside trench 220 to form continuous field oxide region 240. As a result, grown oxide in trench 220 merges with field oxide portions 209 and 211 to form continuous field oxide region 240. By way of example, field oxide region 240 can have a thickness of approximately 3000.0 Angstroms. Since substantially no lateral etching occurs in field oxide portions 209 and 211, substantially no cavities are formed on top surface 236 of field oxide region 240, which is formed when field oxide portions 209 and 211 are joined by oxide grown in trench 220.

As discussed above, hard mask 216 is removed at step 156. By removing hard mask 216 at step 156, the present invention's deep trench isolation process advantageously avoids lateral etching in field oxide portions 209 and 211 that can occur as a result of removing hard mask 216. As a result, the present invention advantageously achieves a field oxide region, i.e. field oxide region 240, having substantially no cavities on its top surface, i.e. top surface 236.

In contrast, in a conventional deep trench isolation process, the hard mask is generally removed after the polysilicon recess etch, which occurs at step 160. In addition, in the conventional process, the oxide liner is removed with the hard mask, which further increases the thickness of the material that must be removed in an etching process. Furthermore, since, in the conventional process, the hard mask has a non-uniform thickness as a result of hard mask etching that occurs during trench etching, the material to be removed has a non-uniform thickness as well as an overall increased thickness. As a result, in the conventional process, a wet strip, such as a BOE wet strip, cannot be used to remove the hard mask and oxide liner without causing severe field oxide undercutting. Thus, in the conventional process, a dry etch process is used to remove the hard mask and oxide liner. However, the dry etch process results in formation of undesirable deep cavities in the top surface of field oxide situated above the deep trench isolation region. The result of step 162 of flowchart 100 is illustrated by structure 262 in FIG. 2G.

Referring to step 164 in FIG. 1 and structure 264 in FIG. 2G, at step 164 of flowchart 100, nitride layer 214 is removed. Nitride layer 214 can be removed by utilizing a phosphoric etch process or other appropriate etch process as known in the art. As a result of the present invention, deep trench isolation region 242 is effectively formed underneath field oxide region 240. Thus, by effectively removing the hard mask prior to a polysilicon recess etch and preserving an oxide liner comprising thermally grown oxide, the present invention advantageously achieves a field oxide region, i.e. field oxide region 240, having substantially no cavities formed on its top surface. As a result, the present invention advantageously achieves a substantially flat topography over the deep trench isolation region.

It is appreciated by the above detailed description that the invention provides a method for effectively forming a deep trench isolation region. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for forming deep trench isolation and related structure have been described.

What is claimed is:

1. A method for forming a deep trench isolation region in a substrate, said method comprising steps of:
    forming a layer of nitride over said substrate and over a first field oxide region in said substrate;
    forming a hard mask over said layer of nitride;
    forming a trench in said first field oxide region and said substrate, said trench defining first and second sidewall in said substrate, said forming said trench causing first and second field oxide portions to be formed adjacent to said first and second sidewalls of said trench, respectively;
    removing said hard mask after said forming said trench;
    thermally growing an oxide liner on said first and second sidewalls of said trench after said removing said hard mask;
    conformally depositing a layer of polysilicon on said layer of nitride and in said trench, said layer of polysilicon filling said trench;
    forming a continuous second field oxide region directly above said trench by growing oxide inside said trench to merge said first and second field oxide portions;
    wherein substantially no lateral etching occurs in said first and second field oxide portions prior to said thermally growing said oxide liner;
    and wherein a substantially flat topography is achieved over said deep trench isolation region.

2. The method of claim 1 wherein said second field oxide region has a top surface, wherein said top surface of said second field oxide region comprises substantially no cavities caused by lateral etching.

3. The method of claim 1 further comprising a step of forming a photoresist mask on said hard mask after said step of forming said hard mask and prior to said step of forming said trench in said substrate.

4. The method of claim 1 wherein said step of removing said hard mask comprises etching said hard mask in an anisotropic dry etch process, said anisotropic dry etch process being selective to nitride and silicon.

5. The method of claim 1 wherein said oxide liner has a thickness of approximately 1000.0 Angstroms.

6. The method of claim 1 wherein said hard mask is selected from the group consisting of densified TEOS oxide and HDP oxide.

7. The method of claim 1 further comprising a step of etching back said layer of polysilicon in said trench after said step of conformally depositing said layer of polysilicon and prior to said step of forming said second field oxide region.

8. The method of claim 7 wherein said second field oxide region has a top surface, wherein said top surface of said second field oxide region comprises substantially no cavities caused by lateral etching.

* * * * *

UNITED STATES PATENT AND TRADEMARK OFFICE
CERTIFICATE OF CORRECTION

| | |
|---|---|
| PATENT NO. | : 7,015,115 B1 |
| APPLICATION NO. | : 10/371307 |
| DATED | : March 21, 2006 |
| INVENTOR(S) | : Yin et al. |

Page 1 of 1

It is certified that error appears in the above-identified patent and that said Letters Patent is hereby corrected as shown below:

Column 7, line 47, "sidewall" should be changed to --sidewalls--.

Signed and Sealed this

Fifteenth Day of July, 2008

JON W. DUDAS
*Director of the United States Patent and Trademark Office*